United States Patent
Roth et al.

(10) Patent No.: US 8,955,219 B2
(45) Date of Patent: Feb. 17, 2015

(54) METHOD FOR FABRICATING A BOND

(75) Inventors: Roman Roth, Sattendorf (AT); Dirk Siepe, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 1096 days.

(21) Appl. No.: 12/709,552

(22) Filed: Feb. 22, 2010

(65) Prior Publication Data

US 2010/0212153 A1 Aug. 26, 2010

(30) Foreign Application Priority Data

Feb. 20, 2009 (DE) .......................... 10 2009 001 028

(51) Int. Cl.
*H01R 43/00* (2006.01)
*H05K 13/00* (2006.01)

(52) U.S. Cl.
USPC .................. 29/854; 29/831; 29/842; 29/846; 257/690; 257/697; 257/734; 257/787; 361/774; 361/777; 438/26; 438/51; 438/55; 438/64; 438/106

(58) Field of Classification Search
USPC ............ 29/830–832, 842–846, 854; 257/690, 257/697, 734, 787, 784, E23.079; 361/774, 361/777; 438/26, 51, 55, 64, 106
See application file for complete search history.

(56) References Cited

U.S. PATENT DOCUMENTS

| | | | |
|---|---|---|---|
| 4,856,185 A | | 8/1989 | Baumgartner et al. |
| 5,298,715 A | * | 3/1994 | Chalco et al. ............ 219/121.64 |
| 5,374,469 A | * | 12/1994 | Hino et al. ..................... 428/209 |
| 5,565,378 A | | 10/1996 | Harada et al. |
| 5,950,306 A | * | 9/1999 | Suzuki et al. .................. 29/852 |
| 6,212,768 B1 | * | 4/2001 | Murakami ....................... 29/840 |
| 6,894,398 B2 | * | 5/2005 | Pon ................................ 257/786 |
| 8,384,091 B2 | * | 2/2013 | Yoo ................................ 257/79 |
| 2004/0082174 A1 | | 4/2004 | Shieh et al. |

FOREIGN PATENT DOCUMENTS

| | | |
|---|---|---|
| DE | 10062108 A1 | 6/2002 |
| DE | 102005028951 A1 | 12/2006 |
| DE | 102005033469 A1 | 2/2007 |
| EP | 0275433 A1 | 7/1988 |

(Continued)

OTHER PUBLICATIONS

Amro et al., "Power Cycling at High Temperature Swings of Modules with Low Temperature Joining Technique," Proceedings of the 18th International Symposium on Power Semiconductor Devices & IC's—Naples, Italy, Jun. 4-8, 2006, pp. 1-4, IEEE.

(Continued)

*Primary Examiner* — Paul D Kim
(74) *Attorney, Agent, or Firm* — Murphy, Bilak & Homiller, PLLC

(57) ABSTRACT

The invention relates to a method for fabricating a bond by providing a body including a metallic surface provided with an inorganic, dielectric protective layer. The protective layer covers at least one surface zone of the metallic surface in which the metallic surface is to be electrically conductive bonded to a contact conductor. To fabricate the bond, a portion of a provided contact conductor above the surface zone is pressed on to the protective layer and the body so that the protective layer is destroyed above the surface zone in achieving an electrically conductive bond between the metallic surface and the contact conductor.

24 Claims, 8 Drawing Sheets

(56) References Cited

FOREIGN PATENT DOCUMENTS

| EP | 0520294 A1 | 12/1992 |
| EP | 1780783 A1 | 9/2006 |

OTHER PUBLICATIONS

Fauty et al., "Room Temperature Ultrasonic Wirebonding with Large Diameter Copper Wire," The International Journal of Microcircuits and Electronic Packaging, 3rd quarter 1999, pp. 221-232, vol. 22, No. 3, International Microelectronics and Packaging Society.

Harder et al., "Bonden mit Kupferdraht in der Leistungselektronik," pp. 123-127, 2003.

Harman, "Ultrasonic Bonding Systems and Technologies Including Ultrasonic Wire Bonding Mechanism," Wire Bonding in Microelectronics, 2nd ed., pp. 11-41, 1997, The McGraw-Hill Companies, Inc.

Osterwald, "Verbindungsbildung beim Ultraschall-Drahtbonden—Einfluß der Schwingungsparameter und Modellvorstellungen," pp. 44-57, 1999, Berlin.

Schütze, T., et al., "Further improvements in the reliability of IGBT modules." Thirty-Third Industry Applications Conference, Oct. 12, 1998-Oct. 15, 1998, pp. 1022-1025, vol. 2, St. Louis, MO.

Yamada, J., et al., "The Latest High Performance and High Reliability IGBT Technology in New Packages with Conventional Pin Layout," PCIM (Power Conversion Intelligent Motion) Europe, May 21-23 2003, pp. 1-5, Nuernberg, Germany.

\* cited by examiner

METHOD FOR FABRICATING A BOND

PRIORITY CLAIM

This application claims priority to German Patent Application No. 10 2009 001 028.9-34, filed Feb. 20, 2009, the content of which is incorporated by reference herein in its entirety.

BACKGROUND

The invention relates to a method for fabricating a bond by bonding an electrical contact conductor to a bond partner. The durability of such bonds can be diminished, however, when the metallic surface of the bond partner is altered by an unwanted chemical reaction, for example, oxidation of the metallic surface. Such oxidations can occur, e.g., when the bond partner is exposed to an oxygenated atmosphere for a lengthy period of time and/or high temperatures before the bond is made.

When, for example, a copper contact conductor is bonded to a copper layer whose surface is already oxidized no satisfactory durably effective electrically conductive bond is achieved because its life is shortened. It is particularly when such a bond is exposed to frequent wide-ranging changes in temperature that there is often the problem of the contact conductor becoming detached from the copper layer. However, problems of this kind are not just limited to copper or bond partners and/or contact conductors containing copper.

One way of getting around these problems is to provide the metallic surface of the bond partner with a protective layer of a precious metal to thus prevent oxidation or some other change in the metallic surface to be bonded. This is done by using bond leads in the form of wires likewise made fully or at least mainly of a precious metal. However, it is particularly in the field of power electronics that high amperages are involved necessitating the use of heavy gauge bond leads and/or circuiting numerous bond leads electrically in parallel. Using precious metals for protective layers and bond leads hikes the material costs not just in making bonds in small-signal electronics but even more so in power electronics. There is thus a need for a lower-cost solution.

A further disadvantage of such precious metal protective layers is that they are very soft and—when a contact conductor is bonded to the protected metallization—act as a lubricant, detrimenting the quality of the bond. Apart from this, applying a precious metal protective layer makes for additional work, adding to the expense in fabrication. There is thus a need to avoid the cited disadvantages by an improved method for fabricating a bond.

SUMMARY

The methods described herein serve to fabricate an electrically conductive bond between a metallic surface of a body and a contact conductor. For this purpose, a body is made available featuring a metallic surface provided with an inorganic, dielectric protective layer. This protective layer covers at least a surface zone of the metallic surface in which the metallic surface is intended to be electrically conductively bonded to a contact conductor. After making available a contact conductor, a portion of the contact conductor is pressed by means of a pressing force applied top-down to the surface zone to the protective layer and bond so that the protective layer topping the surface zone is destroyed in fabricating an electrically conductive bond between the metallic surface and the contact conductor.

Destroying the protective layer occurs mainly or exclusively during bonding, during which the contact conductor oscillates roughly parallel to the metallic surface, for example due to the effect of an ultrasonic bondhead, just the force of the pressure alone not being sufficient generally. Due to the flow of material of the protective layer, the hard protective layer is cracked at the bond site and worked into the bond in the form of minute fragments.

At the point in time of applying the protective layer the metallic surface of the bond is substantially free of metallic oxides or other unwanted chemical surface changes, at least in the region of the surface zone. The bond involved may be, for example, a power semiconductor chip (e.g., a MOSFET, an IGBT, a J-FET, a thyristor, a diode) provided with a metallic contact pad (e.g., the metallization of an anode, cathode, emitter, collector of a base or gate contact) the surface of which is provided with an inorganic, dielectric protective layer at least in the region of a predefined bond site. The contact conductor which may be, for example, a bond wire or a metal ribbon is then applied to the protective layer to fabricate an electrically conductive bond in accordance with the method as described above and pressed into contact with the protective layer and the power semiconductor chip by means of a bonder, for example an ultrasonic bondhead so that the protective layer is destroyed in fabricating a bond between the contact conductor and the metallization of the power semiconductor chip.

In a corresponding way contact conductors can also be bonded to other metal surfaces provided with an inorganic, dielectric protective layer and thus to any bond having a metallic surface. Using an inorganic, dielectric protective layer has the added advantage that it can be safely exposed to higher temperatures which in certain applications benefits the process since, now, any high temperature steps needed after application of the protective layer and before fabricating a bond can be implemented, unlike organic protective layers with the disadvantage of they only being capable of withstanding low temperatures.

According to an embodiment of a method for fabricating a bond, the method comprises the steps of providing a body comprising a metallic surface provided with an inorganic, dielectric protective layer covering at least one surface zone of the metallic surface in which the metallic surface is to be electrically conductive bonded to a contact conductor, providing a contact conductor, destroying the protective layer above the surface zone by generating a press force F pressing a portion of the contact conductor to the protective layer and body above the surface zone, and fabricating an electrically conductive bond between the metallic surface and the contact conductor.

Those skilled in the art will recognize additional features and advantages upon reading the following detailed description, and upon viewing the accompanying drawings.

BRIEF DESCRIPTION OF THE DRAWINGS

The invention will now be detailed by way of example aspects with reference to the drawings, the figures of which, to better illustrate details, are generally not true to scale and in which.

Unless stated otherwise like reference numerals identify like or corresponding elements having the same or corresponding function in the Figures.

DETAILED DESCRIPTION

Illustrated in FIGS. 1A to 1I are the various steps of a method for fabricating a bond.

Figure 1A:
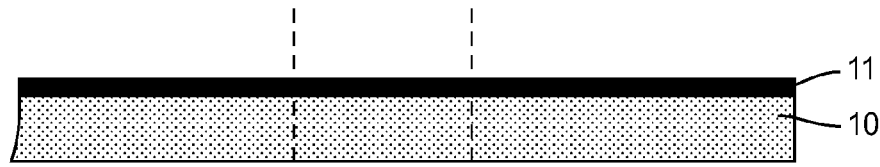
FIGS. 1A-1I show various steps involved in a method for fabricating a bond between a contact conductor and a metallic surface provided with an inorganic, dielectric protective layer.

Referring now to FIG. 1A, there is illustrated a vertical section through a portion of a power semiconductor chip including a semiconductor body 10 on which a barrier layer 11 is applied. The semiconductor body 10 is made of an optional semiconductor substrate material, for example silicon or silicon carbide and comprises an inner structure (not shown) to be understood particularly as doped semiconductor zones, dielectric layers as employed, for example, to insulate gate contacts, or the like.

Figure 1B:
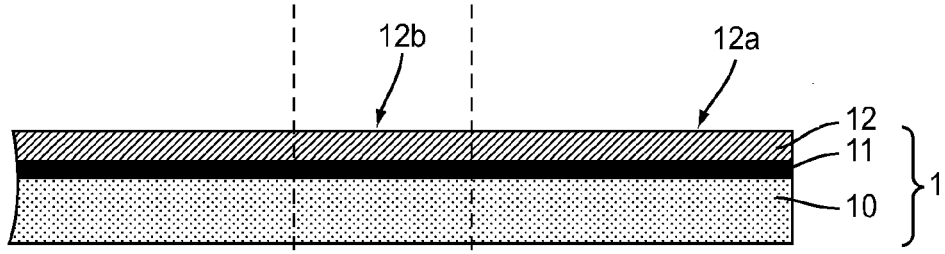

The zone of the semiconductor body 10 as shown is intended to be contacted electrically to the outside by means of a contact conductor. For this purpose a metallization 12 as shown in FIG. 1B is applied to the electrically conductive barrier layer 11. The metallization 12 may be, for example, a metallization plane of the power semiconductor chip by which several cells of a transistor structure are to be interconnected electrically conductive. It is just as possible, however, that the metallization 12 is a conductor track interconnecting optional portions of the semiconductor body 10. In all of these cases, the metallization 12 satisfies a dual function, namely producing an electrically conductive bond of various portions of the semiconductor body 10 as well as producing an electrically conductive bond to an external contact element. As an alternative, a metallization 12 may also be simply provided to exclusively satisfy the aforementioned purpose, as is the case, for example, when the metallization 12 simply involves a bond pad. A suitable material for the metallization 12 as well as for the contact conductor 30 is, for example, copper either pure or alloyed with a minor percentage of some other material. In other aspects, the material of the metallization 12 and/or of the contact conductor 30 may also feature a copper percentage exceeding 10% by weight, for instance.

The barrier layer 11 disposed between the semiconductor body 10 and the metallization 12 serves as a barrier to the diffusion of metals of the metallization 12 into the semiconductor body 10. The barrier layer 11 is electrically conductive and can be formed, for example, of one of the elements tantalum, titanium, tungsten and their nitrides, or an alloy of at least one of these substances.

The combination of semiconductor body 10, barrier layer 11 and metallization 12 thus forms a body 1 provided with a metallic surface 12a simultaneously forming a surface of the body 1 and on which a surface zone 12b is defined in which later an electrically conductive bond is to be bonded electrically conductive to the metallic surface 12a or the metallization 12.

Figure 1C:
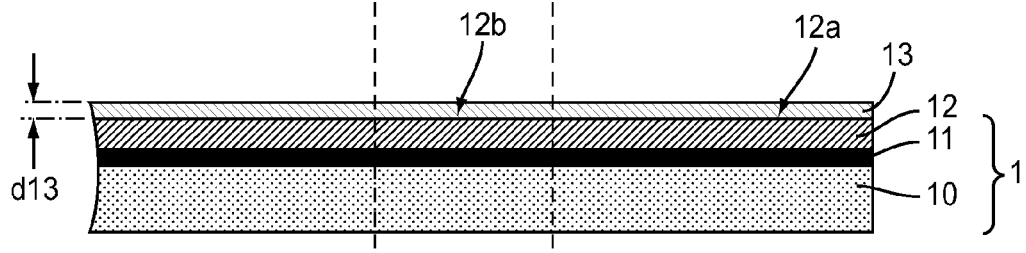

In a condition in which the metallic surface 12a as shown in FIG. 1B is not oxidized, or only to a negligible degree, a protective layer 13 is applied to this metallic surface 12a at least in the surface zone 12b, the protective layer 13 totally covering the metallic surface 12a at least in the region of the surface zone 12b in thus preventing in the covered portion a further oxidation of the metallic surface 12a as is shown in FIG. 1C. The thickness d13 of the protective layer 13 can range from 40 nm to 400 nm, for example, although greater or smaller thicknesses are possible, of course.

Referring now to FIG. 1 C, there is illustrated how in the depicted arrangement, for example, a body 1 comprising a metallic surface 12a is provided in a predefined surface zone 12b as well as alongside thereof an inorganic, dielectric protective layer 13.

Where necessary such a body 1 after application of the protective layer 13 may be subjected to one or more further steps in the process as are necessary to provide the body 1 with essential properties needed in particular for its function. These further steps in the process may involve, for example, applying one or more additional layers to the body 1.

Thus, in accordance with one possible aspect, for example, at least one further layer can be applied to the protective layer 13 so that the protective layer 13 is disposed between the body 1 and the at least one further layer. In this arrangement, the protective layer 13 may be configured underneath a layer applied thereto as a closed layer. It is just as possible, however, that the protective layer 13 is patterned underneath one such further layer. For example, the protective layer 13 underneath an additional metallization layer applied thereto may be fabricated with a window into which the metallization layer applied thereto extends, in thus fabricating an electrically conductive bond to the metallic surface 12a bottoming the protective layer 13.

Figure 1D:
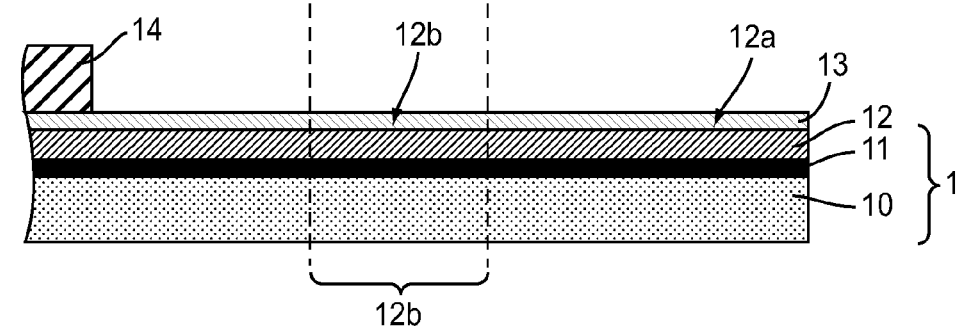
Figure 1E:
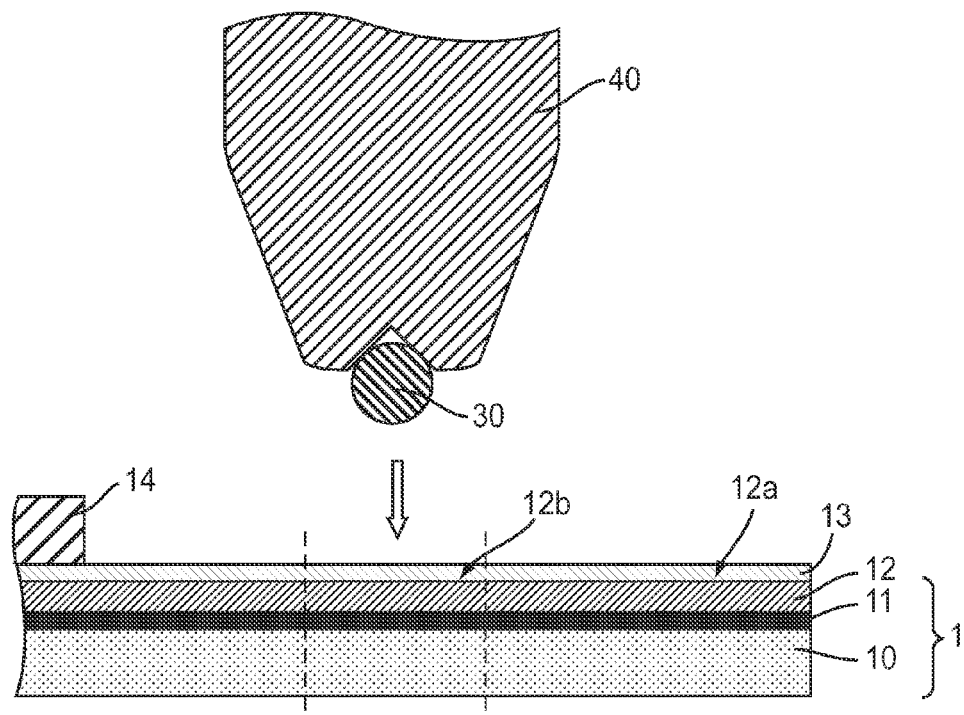

Referring now to FIG. 1D, there is illustrated an example in which a further metallization layer 14 is applied externally, i.e., alongside the surface zone 12b to the metallic surface 12a.

It is likewise just as possible to apply one or more further layers alongside the protective layer 13 to the metallic surface 12a, this making it necessary, however, that the protective layer 13 does not totally cover the metallic surface 12a.

It is understood that applying one or more further layers to the body 1 above and/or alongside the protective layer 13 is merely cited as an example that further steps in the process may be completed after having applied the protective layer 13 to the body 1. Such further steps in the process may involve, for example, etching trenches or fabricating electrically conductive connections of the body 1 to other objects, or temperature steps, such as e.g., for diffusing out dopants incorporated in the semiconductor body 10, healing lattice errors after a radiation or implantation step, or as may be necessary for producing a thermal oxide.

Using an inorganic, dielectric material to produce the protective layer 13 has the advantage that the body 1 after application of the protective layer can now be safely exposed to one or more temperature steps in which the protective layer 13 may be heated to temperatures exceeding 250° C., 300° C. or even 400° C. without detrimenting its function as a protective layer to protect the metallic surface 12a from becoming oxidized and from other unwanted chemical changes.

Another advantage of such an inorganic, dielectric protective layer 13 is that in certain cases it can be produced without additional steps in processing, for instance, when—as shown in FIG. 1D—an inorganic, dielectric protective layer 13 is needed in any case between two metallizations 12 and 14. If such an insulating layer is made of an inorganic, dielectric material, it can also double as the protective layer 13. In other words, the protective layer 13 has a dual function in such a case.

Referring now to FIGS. 1E to 1I, a possible method for fabricating a bond will now be detailed in explaining how an electrically conductive bond is produced between a contact conductor 30 and the metallic surface 12a in the predefined surface zone 12b as shown in FIG. 1D.

Figure 1F:
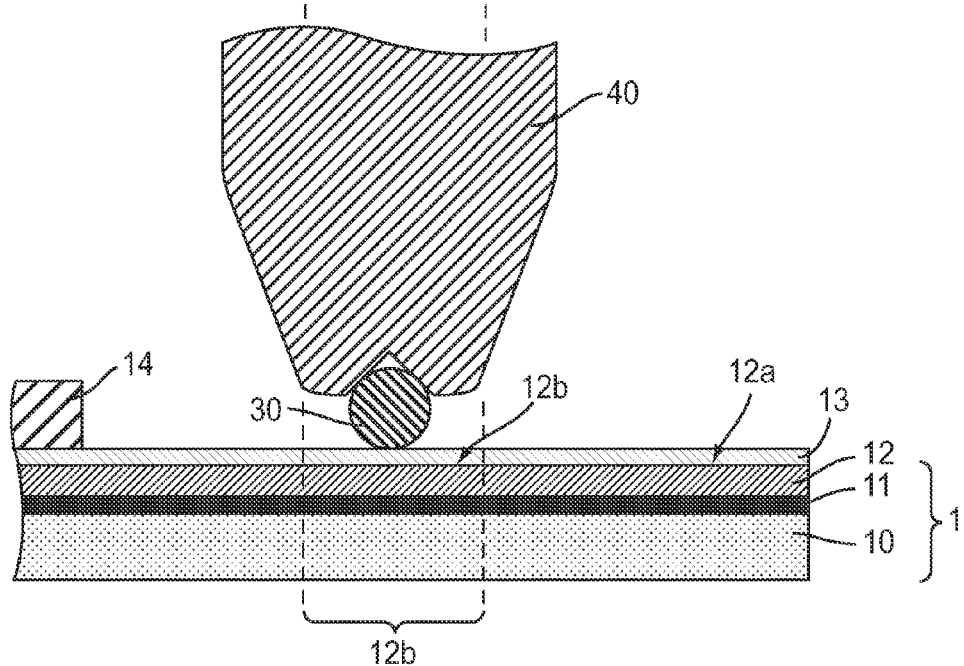

Referring now to FIG. 1F, there is illustrated how, for this purpose, a zone of the contact conductor 30 topping the surface zone 12b is applied to the protective layer 13 applied to the metallic surface 12a and pressed into contact with the protective layer 13 and body 1 by means of a press-bonder 40. Due to the press force F applied thereby, the contact conductor 30 breaks through the protective layer 13 resulting in an electrically conductive bond between the contact conductor 30 and metallic surface 12a or metallization 12.

To support breaking through the protective layer 13 and/or configuring a bond or, indeed, to make it possible at all, the press-bonder 40 is caused to laterally oscillate so that the bottom end of the press-bonder 40 in the region of the surface zone 12b oscillates substantially parallel to the metallic surface 12a.

Figure 1G:
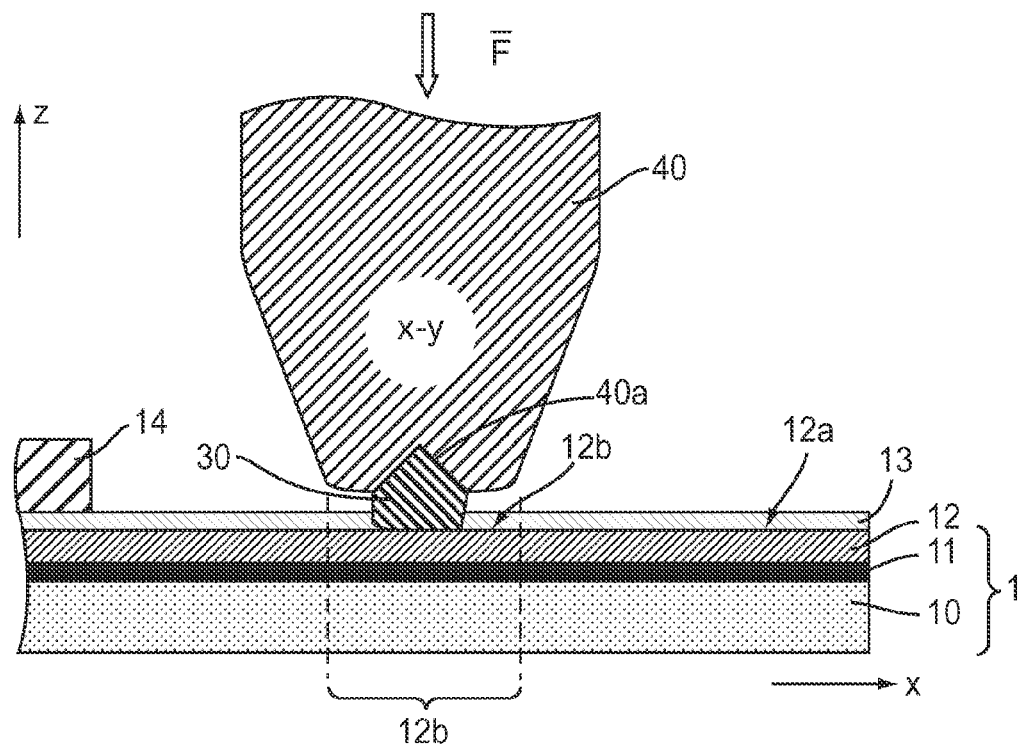

Referring now to FIG. 1G, there is illustrated this arrangement during bonding showing how the bottom end of the press-bonder 40 oscillates in a direction y perpendicular to the normal direction of the surface zone 12b. To create the necessary oscillation an ultrasonic wave can be coupled into the press-bonder 40, for example.

Figure 1H:
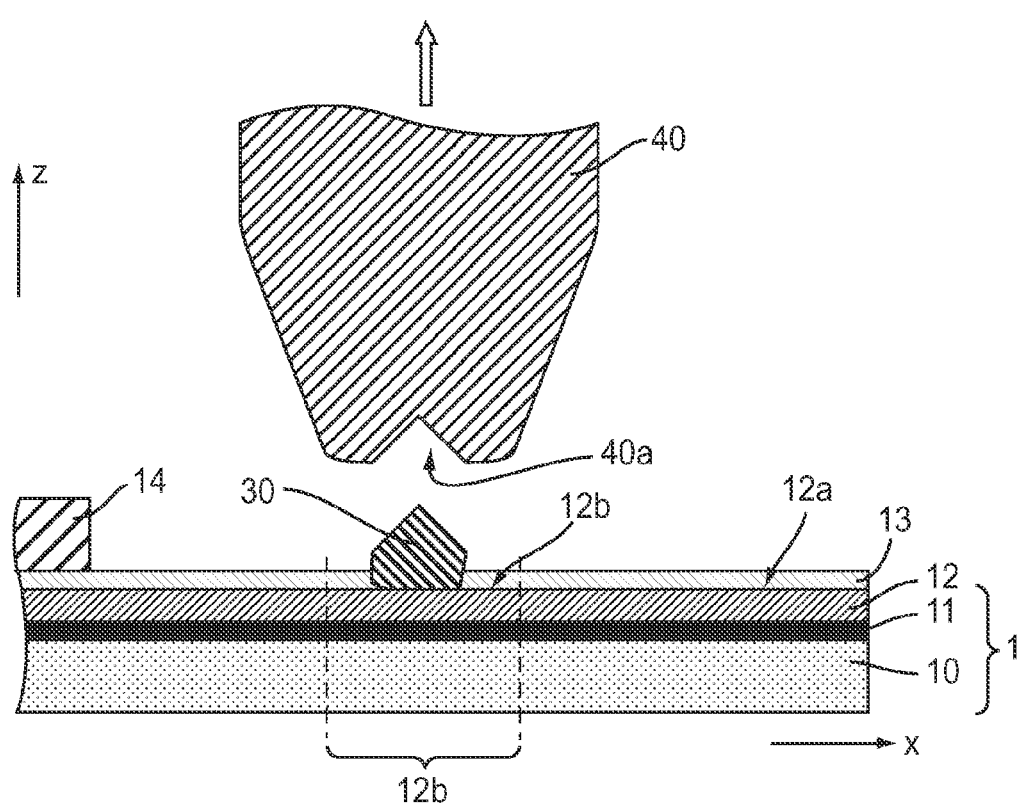

Referring now to FIG. 1H, there is illustrated how the press-bonder 40 is lifted off after fabrication of the bond. In FIGS. 1G and 1H, there is illustrated how in this example aspect the contact conductor 30 is configured as a bond wire which is inserted into an elongated groove 40a of a press-bonder 40 configured as a bondhead and moved together with the press-bonder 40 in the direction of the surface zone 12b for touch-down on the protective layer 13 there. Such a bondhead may be designed for example for fabricating wedge or ball-type bonds. Oscillation of the bondhead occurs in the region of the bond in the direction of the groove 40a and thus (locally) in the direction of the bond wire 30 guided in the groove 40a.

Figure 1I:
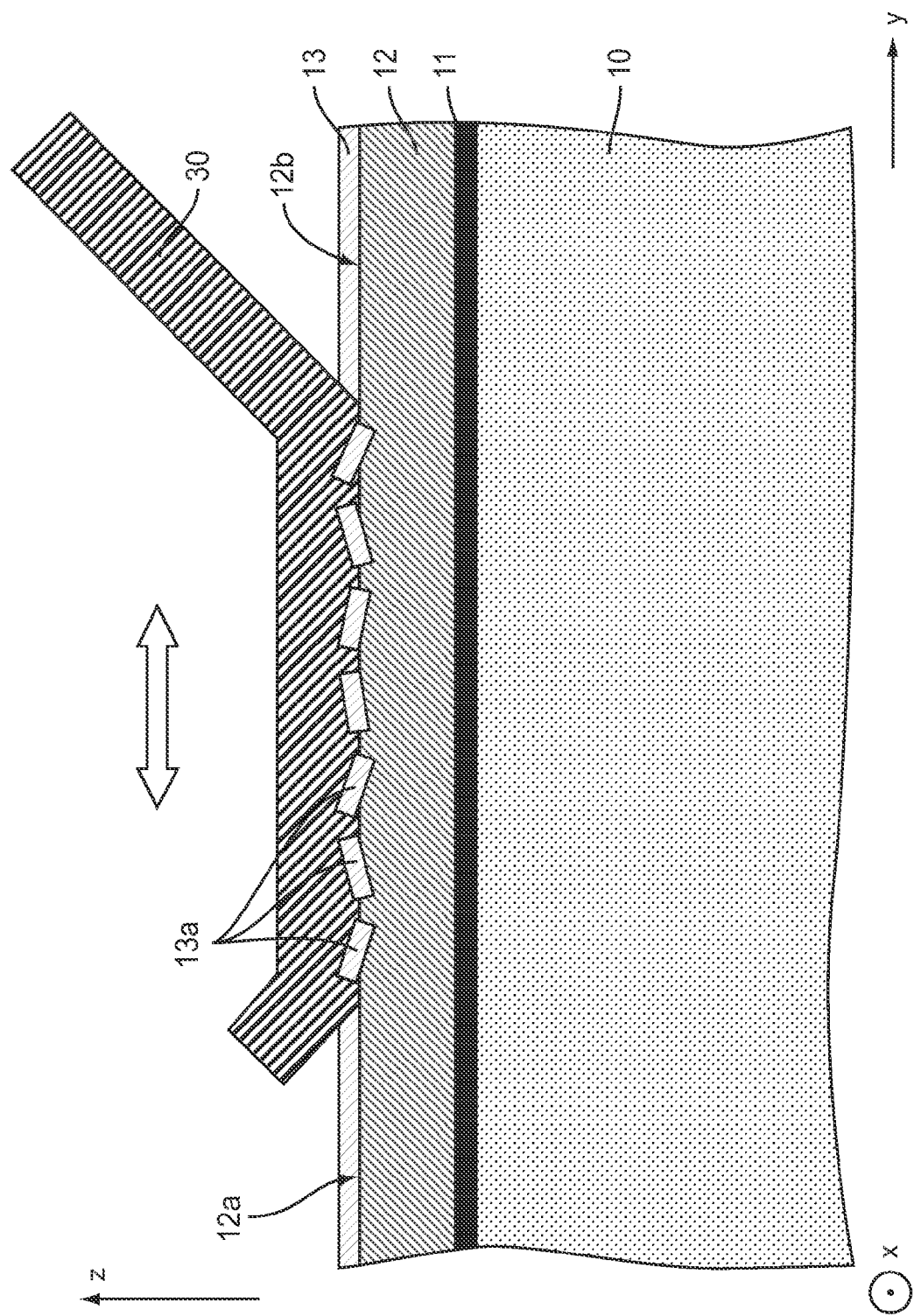

Referring now to FIG. 1I, there is illustrated a vertical section through the completed bond illustrated in a section plane oriented perpendicular to the direction x. The double arrow above the bond site indicates the direction of oscillation of the press-bonder 40. This illustration makes it evident that the protective layer 13 is disrupted and/or pulverized in bonding leaving in the region of the bond site individual components 13a of the protective layer 13 worked into the bond wire 30 and the metallization 12 between the bond wire 30 and the surface zone 12b, thus becoming a component of the bond.

An alternative aspect of the method as explained now makes it possible to firstly top the protective layer 13 with the zone of the contact conductor 30 independently of a press-bonder 40 above the predefined surface zone 12b before applying a press bonder 40 to this zone to press it in the direction of the protective layer 13 and of the body 1 until the protective layer 13 is broken through in fabricating a bond between the contact conductor 30 and the metallic surface 12a or metallization 12.

In this aspect of the method, at least the bottom end of the press-bonding element 40 can be caused to oscillate laterally so that the bottom end of the press-bonder 40 oscillates in the region of the surface zone 12b substantially parallel to the metallic surface 12a in thus promoting breaking through the protective layer 13 and/or forming a bond between the contact conductor 30 and the metallic surface 12a, locally pulverizing the protective layer 13 by these lateral oscillations.

It is, of course, just as possible to employ instead of a contact conductor 30 configured as a bond wire any other suitable conductor, for example, a bent metal ribbon serving as a metallic contact tab for producing an electrically conductive bond.

Figure 2:
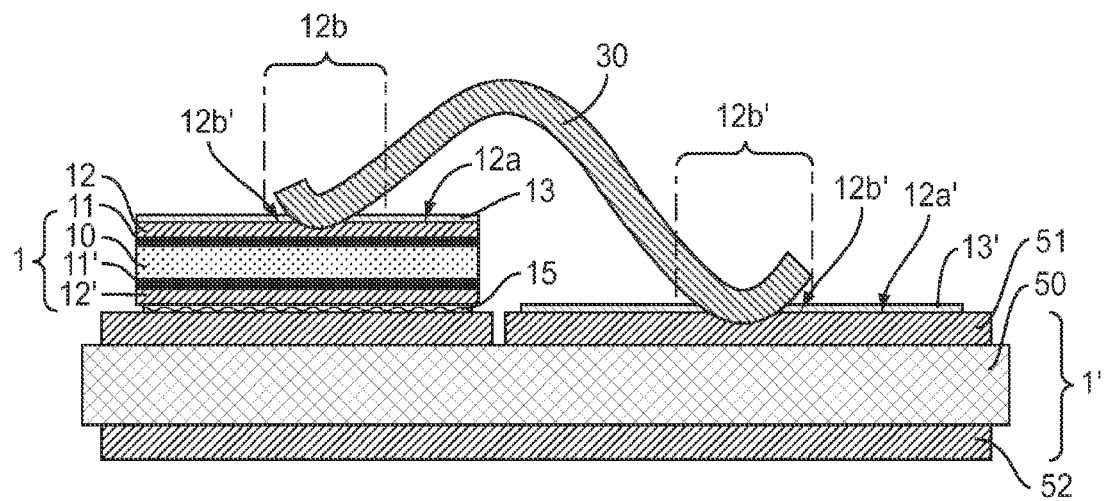
FIG. 2 is a vertical section through a ceramic substrate componented with a power semiconductor chip featuring both a metallization of the power semiconductor chip as well as a metallization of the ceramic substrate each provided with an inorganic, dielectric protective layer destroyed by a contact conductor configured as a bond wire to form electrically conductive connections with the metallizations.

Referring now to FIG. 2, there is illustrated an arrangement with a ceramic substrate 50 topped by a patterned metallization 51 as well as bottomed optionally by a metallization 52. Soldered to a zone of the top metallization 51 by means of an electrically conductive connecting layer 15, e.g., a layer of solder, adhesive or layer of a low-temperature silver compound is a power semiconductor chip 1 comprising a semiconductor body 10 topped by a barrier layer 11 and a metallization 12 and bottomed by a barrier layer 11' and a metallization 12'.

The side 12a of the metallization 12 facing away from the semiconductor body 10 is provided with a protective layer 13 at least in the region of a predefined surface zone 12b of the metallic surface 12a to prevent a chemical change of the surface 12a, particularly an oxidation of the metal of the metallization 12 for example, in prolonged warehousing. The protective layer 13 is made of an inorganic, dielectric material. The semiconductor body 10 provided with the barrier layers 11,11' and metallizations 12, 12' thus forms a body 1 which as explained with reference to FIGS. 1A to 1D is provided on a metallic surface 12a with a protective layer 13 and which after application of the protective layer 13 can be safely exposed to an elevated temperature in which the protective layer 13 is heated to a temperature exceeding, for example, 250° C., 300° C. or even 400° C.

A further zone of the top metallization 51 is provided at its metallic surface 12a' facing away from the ceramic pad 50 with an inorganic, dielectric protective layer 13' at least in the region of a predefined surface zone 12b' of the metallic surface 12a'. This protective layer 13' is designed to protect the metallic surface 12a' at least in the region of the surface zone 12b' from a chemical change, particularly from an oxidation of the material of the top metallization 51.

To electrically conductive bond the surface zones 12b or 12b' to a contact conductor 30, the protective layers 13 or 13' configured as closed layers in the region of surface zones 12b or 12b' are broken through in the region of surface zone 12b or 12b' by corresponding sections of the contact conductor 30 being applied to the protective layer 13 or 13' and press-bonded to the corresponding protective layer 13 or 13' and the corresponding body 1 or 1' by application of a press-bonding force so that the protective layer 13 or 13' in the region of the surface zone 12b or 12b' is broken through to produce an electrically conductive bond between the corresponding contact conductor 30 and the corresponding metallic surface 12a or 12a'.

Figure 3:
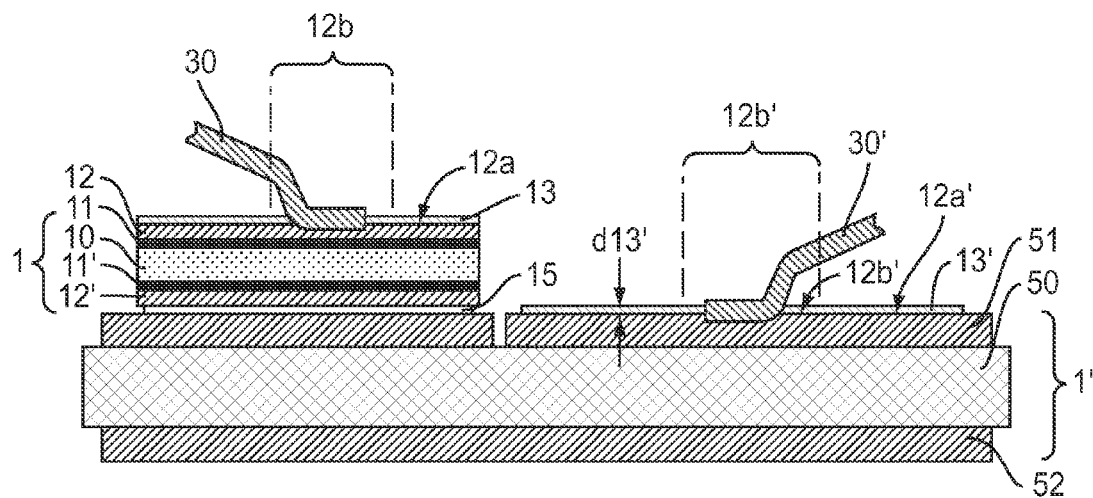
FIG. 3 is a vertical section through a ceramic substrate componented with a power semiconductor chip featuring both a metallization of the power semiconductor chip as well as a metallization of the ceramic substrate, each provided with an inorganic, dielectric protective layer destroyed by a metal ribbon, each of which is bonded in the region of the corresponding window electrically conductive to each metallization.

Referring now to FIG. 3, there is illustrated that whilst the contact conductor 30 as shown in FIG. 2 is configured as a bond wire, by way of example FIG. 3 depicts an arrangement in which the surface zones 12b or 12b' are contacted to contact conductors 30 or 30' configured as bent metal bands, otherwise the structure of the bodies 1 or 1' provided with the protective layers 13 or 13' is the same as the arrangement as shown in FIG. 2.

Figure 4:
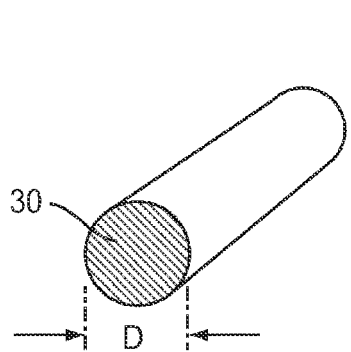
FIG. 4 is a view in perspective of a contact conductor configured as a bond wire.

Referring now to FIG. 4, there is illustrated a view in perspective of a contact conductor 30 configured as a bond wire. The contact conductor 30 has a diameter D amounting to at least 150 µm, 300 µm, 400 µm or at least 500 µm, for example. One such bond wire can be employed as a contact conductor 30 bonded to a metallic surface 12a or 12a' as has already been explained with reference to FIGS. 1A to 1H and FIG. 2.

Figure 5:
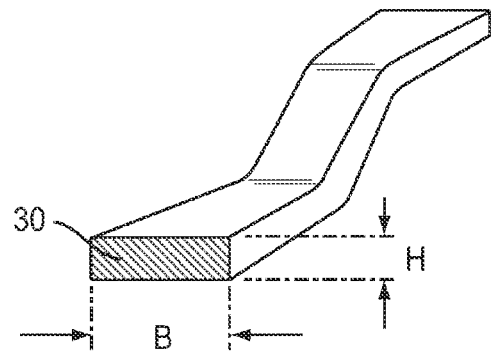
FIG. 5 is a view in perspective of a contact conductor configured as a metal ribbon.

Referring now to FIG. 5, there is illustrated, by contrast, a contact conductor 30 configured, for example, as a bent metal ribbon which may be, e.g., a contact tab of a power semiconductor module for its external electrical contact. One such contact conductor 30 may have a width B, for example, ranging from 500 µm to 4000 µm, preferably at least 1000 µm, 2000 µm or 3000 µm. The height H of the contact conductor 30 may range, for example, from 50 µm to 2000 µm.

Figure 6:
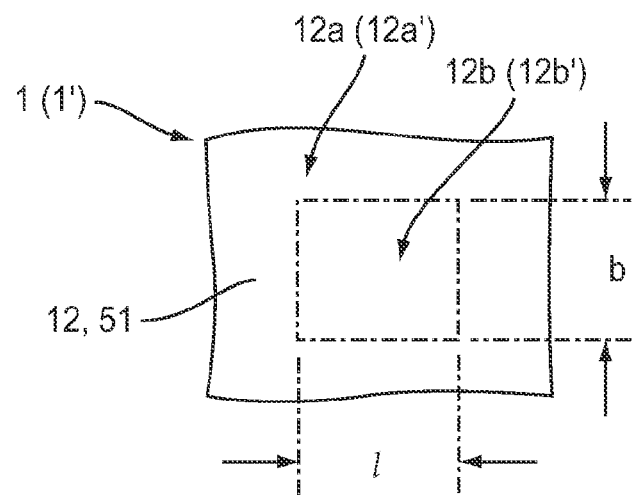
FIG. 6 is a top-down view of a zone of a metallic surface of a bond on which a surface zone is defined in which the bond is to be fabricated.

Referring now to FIG. 6, there is illustrated a top-down view of a metallic surface 12a or 12a' of a body 1 or 1' on which a surface zone 12b or 12b' is defined in which a bond is to be produced between a contact conductor and the metallic surface 12a or 12a' which may be the metallic surface 12a or 12a' having the same reference numerals, for example, as already detailed with reference to the previous Figs.

The surface zone 12b or 12b' has a length l and a width b. The length l may range, for example, from 200 to 4000 µm, the width b, for example, may range from 100 µm to 4000 µm. Where the bond is a semiconductor body of a semiconductor chip featuring bonding to the top metallization, the surface zone may also extend over the active surface of the chip fully or almost fully. Before a bond is produced an inorganic, dielectric protective layer (not shown in FIG. 6) is applied to the surface 12a or 12a'. This layer extends at least over the portion of the surface zone 12b or 12b' and is configured at least in the portion of the surface zone 12b or 12b' as a closed layer. However, optionally, one such protective layer may also be applied externally to the surface zone 12b or 12b', i.e., alongside the surface zone 12b or 12b' on the metallic surface 12a or 12a'.

So that such a protective layer is able to function as wanted, it is necessary that it is applied to the surface zone 12b or 12b' before this has a chance of becoming changed unwantedly chemically, for example, due to oxidation. In other words, it is important that the metallic surface 12a or 12a' already has the needed high quality at least in the portion of the predefined surface zone 12b or 12b' intended for bonding, i.e., it not having suffered a significant change in this portion of the surface zone 12b or 12b' for instance due to oxidation or some other unwanted chemical reaction.

Figure 7:
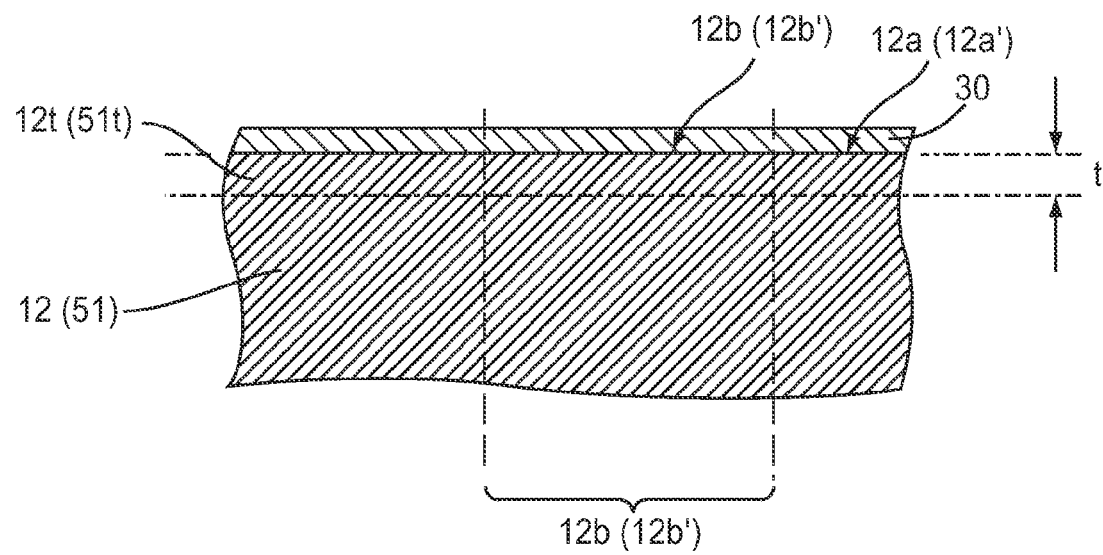
FIG. 7 is a vertical section through a metallization of a bond comprising within a near surface layer no or only a minute percentage of the oxide component of the metallization metal.

Referring now to FIG. 7, there is illustrated thus how it is an advantage when a metallization 12 or 51 comprising the surface zone 12b or 12b' shows no sign of oxidation at least in the portion of the surface zone 12b or 12b' within a layer 12t or 51t extending from the corresponding surface zone 12b or 12b' down to a depth t, exceeding for example 0.1 µm, or that the oxidation percentage is so minor that it fails to detriment the quality of the bond.

An ideal metallic surface 12a or 12a' in this sense, at least in the region of the surface zone 12 or 12b' is achievable and protected by means of an inorganic, dielectric contact conductor 30, for example, by it being applied to the metallic surface 12a or 12a' without delay after the metallization 12 or 51 is produced, i.e., before the metallic surface 12a or 12a' has time to become significantly changed chemically, for example, by the influence of an atmosphere acting on the metallization 12 or 51.

Another possibility of fabricating an ideal metallic surface 12a or 12a' protected by an inorganic, dielectric protective layer is achievable by mechanical and/or chemical treatment of the metallic surface 12a or 12a' when already having undergone a chemical change, for example, due to oxidation as soon as possible before applying the passivation layer 20 at least in the region of the surface zone 12 or 12b' so as to rid it from impurities, for example by an oxide of the metal of the metallization 12 or 51.

Figure 8:
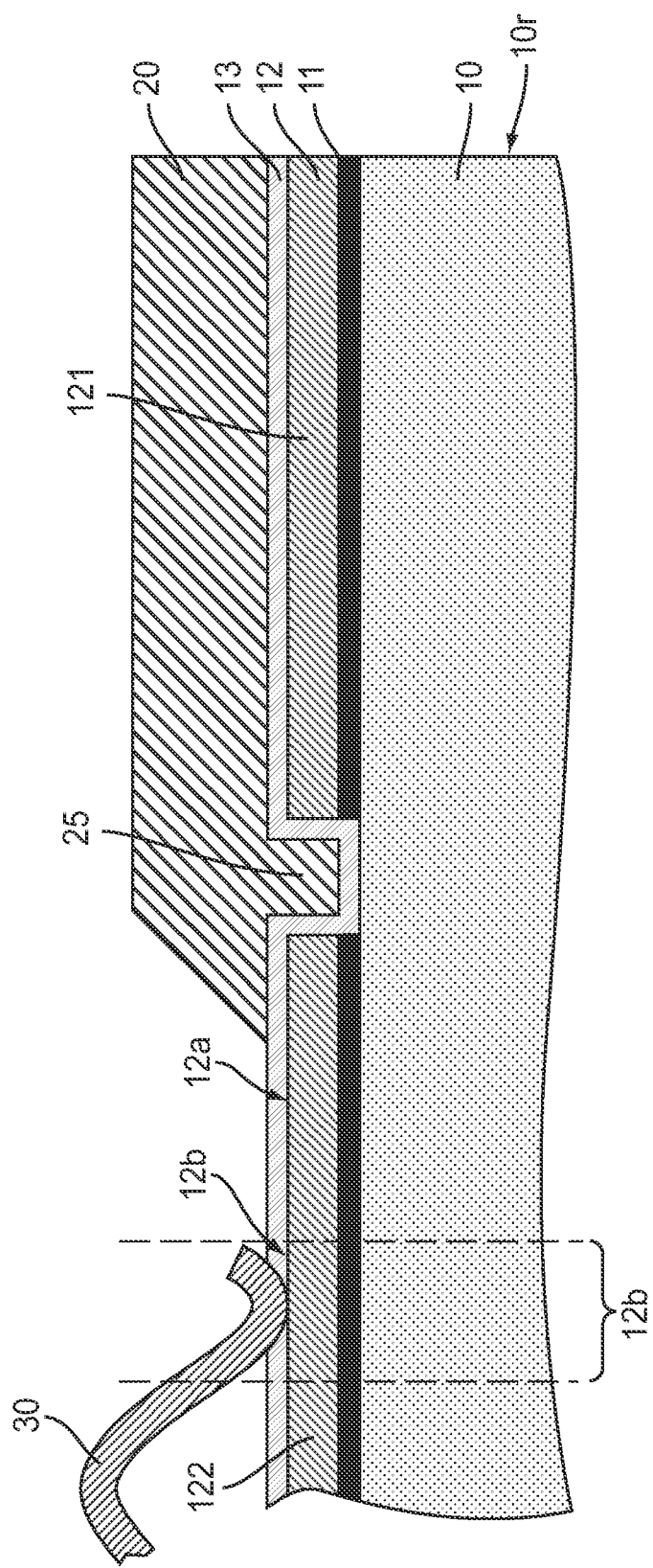
FIG. 8 is a vertical section through an edge zone of a semiconductor chip featuring a bond wire bonded by a protective layer to a chip metallization.

Referring now to FIG. 8, there is illustrated a vertical section through an edge zone of a semiconductor chip comprising a semiconductor 10 to which a barrier layer 11, metallization 12 as well as a protective layer 13 are applied. Not shown is the inner structure of the semiconductor body 10. The side edge of the semiconductor body 10 is identified by the reference numeral 10r. To avoid field peaking in the edge region of the semiconductor body 10 an "edge closure" is provided, comprising trenches 25 which divides the metallization 12 into an edge zone 121 and electrically insulated therefrom and located further inwards a zone 122.

Applied to the metallic surface 12a of the metallization 12 facing away from the semiconductor body 10 is the inorganic, dielectric protective layer 13 which also extends into the trenches 25 covering its bottom and sidewalls. This protective layer 13 is topped furthermore by a passivation layer 20, for example a polyimide, topping each of the zones 121 and 112 sectionwise.

Figure 9:
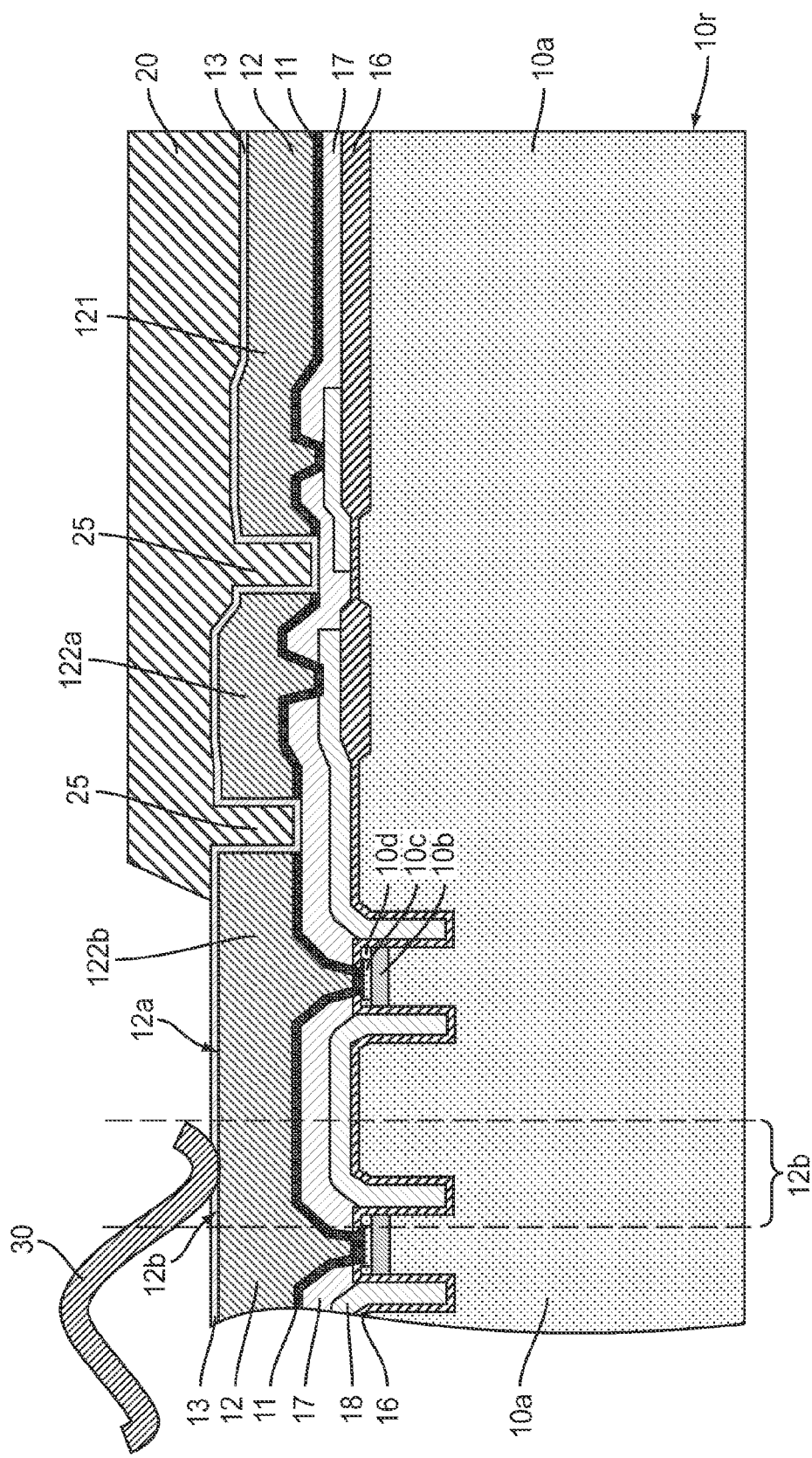
FIG. 9 is a vertical section through an edge zone of a semiconductor chip as shown in FIG. 8 but featuring a different kind of semiconductor chip.

Referring now to FIG. 9, there is illustrated a corresponding edge closure. These component features include several trenches 25 dividing the metallization 12 into an outer edge zone 121 as well as electrically insulated therefrom and located further inwards several zones 122a, 122b. On this component too, the metallic surface 12a of the metallization facing away from the semiconductor body 10 is topped by an inorganic, dielectric protective layer 13 which also extends into the trenches 25 to cover the bottom and sidewalls thereof. Shown furthermore by way of example in FIG. 9 is an inner structure of a semiconductor component whose semiconductor body 10 features differingly doped zones 10a, 10b, 10c and 10d. In addition to this, optional further layers are applied to the semiconductor body 10 and under the metallization 12, 51, for example, a first dielectric layer 16, polyimide layer 18 and a second dielectric layer 17.

On both components as shown in FIGS. 8 and 9 for their electrically conductive a contact conductor 30 is bonded to an inner zone 122 (FIGS. 8) and 122b (FIG. 9) in an inner portion of the component where no passivation layer 20 is provided. These bonds are produced in each case by bonding the bond wire to the protective layer 13 and the body 1 by means of an ultrasonic bonder so that the protective layer 13 is broken through to produce a bond between the bond wire 30 and an inner zone 122, 122b of the metallization 12 as has already been detailed with reference to FIGS. 1A to 1H and FIGS. 2 to 7.

Referring again to FIGS. 8 and 9, there is illustrated how the protective layer 13 assumes a dual function in the two components shown therein, it, for one thing, serving as a protective layer to prevent an unwanted chemical change in the metallic surface 12a of the body 1 in the region of the surface zone 12b provided for bonding, for another, it serving as an insulating layer to electrical insulate different zones of the component from each other.

Furthermore, a semiconductor chip may feature on the bonded or to be bonded surface of its semiconductor body 10 or 10a an active zone, in other words a zone via which a gatable load current of the semiconductor chip flows, i.e., for example a source, drain, emitter, collector, anode or cathode zone. The metallization 12 and the barrier layer 11 then extend over all of the active zone. Correspondingly, the surface zone 12b may also extend over all, or almost all, of the active zone. In addition to this, two or more, instead of just one, contact conductors 30 may be bonded within a surface zone 12b as already explained by way of the previous example aspects.

In all aspects in accordance with the invention an inorganic, dielectric protective layer may comprise, for example, one of the following materials or be made thereof: silicon nitride (Si3N4), silicon oxinitride, silicon oxide (e.g., undoped silicate glass (USG)), phosphor silicate glass (PSG), SiCOH.

Although the previous examples presented cylindrical or ribbon-shaped contact conductors, any other shape thereof may be used. In fabricating bonds particularly in the field of power electronics it is of advantage, in avoiding a plurality of contact conductors to be electrical connected in parallel, to select the cross-sections of the contact conductors correspondingly large. Irrespective of which shape it takes, a contact conductor may comprise a conductor cross-sectional area of, for example, at least 17671 $\mu m^2$, at least 70685 $\mu m^2$, at least 125663 $\mu m^2$ or at least 196349 $\mu m^2$ (corresponding to the cross-sectional area of a cylindrical bond wire for fabricating a bond having a diameter D of at least 150 $\mu m$, 300 $\mu m$, 400 $\mu m$ or at least 500 $\mu m$).

It is understood that the present method can be put to use not just in power electronics but also for fabricating bonds for analog or digital small signal transmission. These may involve, e.g., bonds between a contact conductor and a gate or base contact pad of a controllable semiconductor component, for example, of a bipolar transistor, MOSFET, J-FET, IGBT, thyristor or the like, or bonds circuiting a wealth of different electrical signal and/or power supply connections of an integrated circuit internally and/or externally. One such integrated circuit may be, for example, a metallization comprising one or more metallization planes designed for patterning into conductor tracks and/or electrical contact pads, although it is just as possible that one or more of such metallization planes are not patterned, i.e., configured full surfaced.

As a rule, in small-signal transmission conductor cross-sectional areas of the contact conductors smaller than those as described above may suffice. These smaller conductor cross-sectional areas may be selected, for example, smaller than or equal to 1963 $\mu m^2$, 706 $\mu m^2$ or 490 $\mu m^2$ (corresponding to the cross-sectional area of a cylindrical bond wire for fabricating a bond having a wire diameter D smaller than or equal to 100 $\mu m$, 50 $\mu m$, 30 $\mu m$ or 25 $\mu m$)—depending on the shape of the cross-sectional area of the contact conductor.

It is understood furthermore that all aspects in accordance with the invention a metallization 12 on the surface 12a of which an inorganic, dielectric protective layer as explained is applied may be made fully or at least mainly of one of the following materials or an alloy of at least one material thereof: copper or aluminum.

In accordance with one aspect of the invention in which the body 1 comprises a semiconductor body 10, it is provided for that disposed between the surface zone 12b of the metallization 12 and the semiconductor body 10 there is no layer made fully or at least mainly of aluminum. The advantage of this is that the metallization 12 when press-bonding the contact conductor 30 to the surface zone 12b does not give way as much as would be the case with a comparatively soft aluminum substrate in thus facilitating breaking through the protective layer during bonding.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

The invention claimed is:

1. A method for fabricating a bond comprising the steps:
providing a body comprising a metallic surface provided with an inorganic, dielectric protective layer covering at least one surface zone of the metallic surface in which the metallic surface is to be electrically conductive bonded to a contact conductor;
providing a contact conductor;
destroying the protective layer above the surface zone by pulverizing in addition to generating a press force F pressing a portion of the contact conductor to the protective layer and body above the surface zone;
fabricating an electrically conductive bond between the metallic surface and the contact conductor.

2. The method as set forth in claim 1 wherein the metallic surface is substantially free of metallic oxides at least in the region of the surface zone.

3. The method as set forth in claim 1 wherein the metallic surface is substantially free of copper oxides at least in the region of the surface zone.

4. The method as set forth in claim 1 wherein the body further comprises a metallization having a copper percentage of at least 10% by weight, or wherein the metallization is made fully or at least mainly of copper.

5. The method as set forth in claim 1 wherein the contact conductor comprises a copper percentage of at least 10% by weight, or wherein the contact conductor is made fully or at least mainly of copper.

6. The method as set forth in claim 1 wherein the contact conductor is configured as a metal ribbon and
featuring a width B exceeding or equaling 1000 $\mu m$, exceeding or equaling 2000 $\mu m$ or exceeding or equaling 3000 $\mu m$; or a width ranging from 50 $\mu m$ to 2000 $\mu m$; and/or
featuring a height ranging from 50 $\mu m$ to 2000 $\mu m$.

7. The method as set forth in claim 1 wherein the contact conductor is configured as a bond wire and featuring before bonding, a diameter of at least 300 $\mu m$, at least 400 $\mu m$ or at least 500 $\mu m$.

8. The method as set forth in claim 1 wherein the contact conductor comprises a conductor cross-sectional area of at least 17671 $\mu m^2$, or at least 70685 $\mu m^2$, or at least 125663 $\mu m^2$ or at least 196349 $\mu m^2$.

9. The method as set forth in claim 1 wherein the contact conductor comprises a conductor cross-sectional area of smaller than or equal to 7854 $\mu m^2$, smaller than or equal to 1963 $\mu m^2$, smaller than or equal to 706 $\mu m^2$ or smaller than or equal to 490 $\mu m^2$.

10. The method as set forth in claim 1 wherein destroying the protective layer is done by ultrasonic bondhead oscillating substantially perpendicular to the direction of the press force.

11. The method as set forth in claim 1 wherein the at least one surface zone comprises a length ranging from 200 µm to 4000 µm and/or a width ranging from 100 µm to 4000 µm.

12. The method as set forth in claim 1 wherein the at least one surface zone comprises a surface area of at least 20000 µm$^2$.

13. The method as set forth in claim 1 wherein the body is a semiconductor which comprises an integrated circuit or component of an integrated circuit and which is topped by an active zone, the surface zone extending over the active zone fully or almost fully.

14. The method as set forth in claim 13 wherein no layer made fully or at least mainly of aluminum is disposed between the metallic surface and the semiconductor.

15. The method as set forth in claim 13 wherein before and/or after fabrication of the electrically conductive bond no layer of aluminum is disposed between the contact conductor and the semiconductor.

16. The method as set forth in claim 13 wherein disposed between the metallic surface and the semiconductor a barrier layer is formed
   from precisely one of the substances tantalum, titanium, tungsten and their nitrides, or
   from an alloy of at least one of these substances.

17. The method as set forth in claim 1 wherein the body comprises a ceramic pad provided at least on one side with a metallization whose surface facing away from the ceramic pad forms the metallic surface of the body.

18. The method as set forth in claim 17 wherein the ceramic pad is formed from aluminum oxide or aluminum nitride or silicon nitride.

19. The method as set forth in claim 1 wherein the protective layer has a thickness ranging from 40 nm to 400 nm.

20. The method as set forth in claim 1 wherein providing the body comprising the protective layer involves the following steps:
   providing a body comprising a metallic surface;
   defining a surface zone on the metallic surface in which the metallic surface is to be electrically conductive bonded to a contact conductor; and
   applying to the metallic surface a protective layer totally covering at least the surface zone.

21. The method as set forth in claim 1 wherein the protective layer prevents a chemical change in the metallic surface at least in the region of the surface zone.

22. The method as set forth in claim 1 wherein before fabricating the electrically conductive bond at the side of the protective layer facing away from the surface zone no electrically conductive layer is arranged.

23. The method as set forth in claim 1 wherein the protective layer after application to the metallic surface and before fabricating the electrically conductive bond is heated to a temperature exceeding 250° C., exceeding 300° C. or exceeding 400° C.

24. The method as set forth in claim 1 wherein the protective layer includes or is made of one of the following materials; silicon nitride, silicon oxinitride, silicon oxide, e.g., undoped silicate glass, phosphor silicate glass, SiCOH.

* * * * *